US005905393A

United States Patent [19]

Rinderknecht et al.

[11] Patent Number: 5,905,393

[45] Date of Patent: May 18, 1999

[54] UNBUFFERED LATCH RESISTANT TO BACK-WRITING AND METHOD OF OPERATION THEREFOR

[75] Inventors: William John Rinderknecht, Streamwood; Lawrence Edwin Connell, Naperville, both of Ill.

[73] Assignee: Motorola, Inc., Schaumburg, Ill.

[21] Appl. No.: 08/944,777

[22] Filed: Oct. 6, 1997

[51] Int. Cl.[6] .......... H03K 3/356

[52] U.S. Cl. .......... 327/202; 327/210; 327/211

[58] Field of Search .......... 327/202, 203, 327/208–214, 218, 200, 201

[56] References Cited

FOREIGN PATENT DOCUMENTS

| | | | |
|---|---|---|---|
| 1-37114 | 2/1989 | Japan | 327/202 |
| 60260902 | 9/1994 | Japan | 327/202 |

*Primary Examiner*—Tuan T. Lam

*Attorney, Agent, or Firm*—Craig J. Yudell; Keith E. Witek

[57] ABSTRACT

An unbuffered flip-flop includes feedback control circuitry providing adaptive control of the internal node during the transfer and latching phases of the flip-flop to prevent back-writing. A complementary pair of transmission gates controlled by the output node are included in the feedback path between an output buffer and a feedback buffer. As noise voltage variations and spikes alter the voltage on the output node, the charge transmittance of the transmission gates is weakened or shut off, thereby preventing the incorrect logic state from being driven by the feedback buffer through to the input of the flip-flop's output buffer and causing back writing. Because the transmission gate transistors are complementary, one transistor or the other will be operating in a transmissive state for each of the bi-stable states of the output buffer during static operation of the flip-flop. As will be appreciated, because only two extra transistors are needed, the present invention has improved performance while consuming very little silicon area, power, and adding almost no delay to the circuit.

20 Claims, 5 Drawing Sheets

UNBUFFERED LATCH RESISTANT TO BACK-WRITING AND METHOD OF OPERATION THEREFOR

FIELD OF THE INVENTION

The present invention relates in general to bi-stable devices such as latches and flip-flops and, more particularly, to a bi-stable device resistant to back-writing.

BACKGROUND OF THE INVENTION

Bi-stable devices are memory elements that store a digital value (i.e., a 1 or a 0). Bi-stable integrated circuit devices are typically latches or flip-flops that utilize a feedback path to maintain the output in a stable state. If the output of a bi-stable device is unbuffered, the device is vulnerable to a failure called back-writing. Back-writing occurs when noise sources such as capacitive coupling, power supply variation, and/or transmission-gate charge sharing cause voltage variations on the output nodes of the bi-stable device that are large enough to switch the logic state stored in the device via the feedback path. Specifically, for the flip-flop to fail, the feedback path must be faster than the output buffer recovery from the noise spike.

In the prior art, flip-flops and latches generally include buffers at the output nodes to eliminate the possibility of back-writing. However, the additional buffers require more silicon area, more power, and introduce more delay in the circuit. An alternative design in the prior art is an unbuffered flip-flop that limits the size of devices in the feedback path to effectively slow down the response of the feedback path to reduce the possibility of back-writing. These flip-flops are limited in their ability to prevent back-writing by the duration of the noise signal. In complementary metal oxide semiconductor (CMOS) integrated circuits, unbuffered flip-flops and latches are highly desirable because they require less silicon area and less power than buffered flip-flops and latches. It would be desirable to provide an unbuffered flip-flop or latch having an improved ability to resist back-writing.

DESCRIPTION OF A PREFERRED EMBODIMENT

The present invention provides an unbuffered latch or flip-flop that prevents back-writing. A complementary pair of transmission gates controlled by the latch's output node are included in the feedback path between an output buffer and a feedback buffer. As noise voltage variations and spikes alter the voltage on the output node, the charge transmittance of the transmission gates is weakened or shut off, thereby preventing the incorrect logic state from being driven by the feedback buffer to the input of the flip-flop's output buffer. Because the transmission gate transistors are complementary, one transistor or the other will be operating in a transmissive state for each of the bi-stable states of the output buffer. When operating statically, the feedback buffer will strongly drive the output buffer through the feedback path to maintain one of the two bi-stable states. When the output buffer is transitioning between states or when noise introduces voltage variation on the output node, those voltage variations effectively disable the feedback path preventing back-writing. As will be appreciated, because only two extra transistors are needed, the present invention has improved performance while consuming very little silicon area, power, and adding almost no delay to the circuit.

Figure 1:
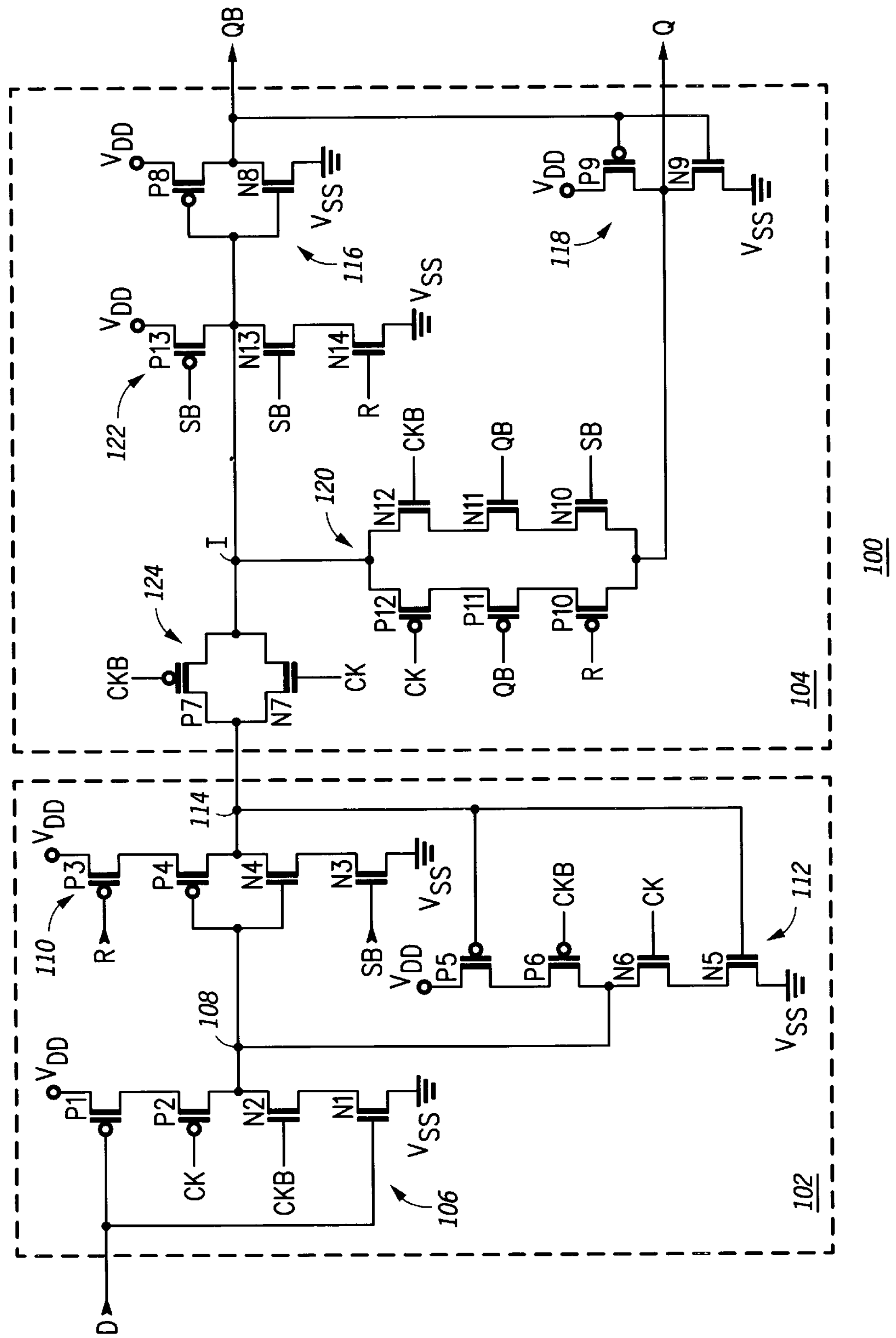
FIG. 1 shows an unbuffered flip-flop having set/reset and back-writing prevention circuitry, in accordance with a preferred embodiment of the present invention.

With reference now to the figures, FIG. 1 shows an unbuffered flip-flop having set/reset and back-writing prevention circuitry, in accordance with a preferred embodiment of the present invention. Flip-flop 100 includes a master latch 102 and a slave latch 104. Flip-flop 100 is designed in CMOS having p-type transistors (PMOS) and n-type transistors (NMOS) (as described herein, PMOS transistors are designated with a "P" followed by a reference number and NMOS transistors are designated with a "N" followed by a reference number. Master latch 102 comprises input buffer 106, master latch output buffer 110, and master latch feedback buffer 112.

Input buffer 106 includes series-connected transistors P1, P2, N2, and N1. Input buffer 106 receives input data (D) at the gates of transistors P1 and N1. Transistor P2 receives a clock (CK) and transistor N2 receives the complement clock (CKB) at their control inputs. A first voltage supply (VDD) is supplied at the source terminal of transistor P1, and a second voltage supply (VSS) is supplied at the source terminal of transistor N1. When the clock signal is not asserted, transistors P2 and N2 allow transistors P1 and N1 to drive node 108 with the inverse of the input data (D), as will be readily understood by those skilled in the art. The output of input buffer 106 drives the input to master latch output buffer 110.

Master latch output buffer 110 includes series-connected transistors P3, P4, N4 and N3. Master latch output buffer 110 receives an input from node 108 at the gates of transistors P4 and N4. Transistor P3 receives a reset signal (R) at its gate, and transistor N3 receives the complement of a set signal (SB) at its gate. Transistor P3 receives VDD at its source terminal, and transistor N3 receives VSS at its source terminal. When neither the set nor reset signals are asserted, transistors P3 and N3 are transmissive and transistors P4 and N4 operate as an inverter to drive output node 114 with the inverse of the voltage on node 108.

Master latch feedback buffer 112 includes series-connected transistors P5, P6, N6, and N5. Output node 114 drives the input to master latch feedback buffer 112 at the gates of transistors P5 and N5. Transistor P5 receives the VDD at its source terminal, and transistor N5 receives VSS at its source terminal. Transistor N6 receives an input of CK at its gate, and transistor P6 receives an input of CKB at its gate. When the clock signal is asserted, transistors P6 and N6 are transmissive, allowing transistors P5 and N5 to operate as an inverter to drive node 108 with the inverse of the voltage signal on node 114.

In operation, a digital data value is presented as input D at the input of master latch 102 to be latched into master latch 102. When the clock signal is negated, input buffer 106 is enabled to drive node 108, and master latch feedback buffer 112 is disabled with transistors P6 and N6 turned off. Assuming that the reset and set signals have not been asserted, master latch output buffer 110 drives output node 114 with the inverse of the voltage on node 108, which is the input data value D. When the input clock is asserted, input buffer 106 is disabled and master latch feedback buffer 112 is enabled to drive the inverse of the voltage on node 114 on node 108, latching the input data value in master latch 102.

Slave latch 104 comprises transmission gate 124, set/reset circuit 122, output buffer (inverter) 116, feedback buffer (inverter) 118, and feedback path circuitry (feedback path circuit) 120. When the clock signal is asserted, transmission gate devices N7 and P7 are turned on to transfer the latched master latch data value into slave latch 104. In other words, during the asserted phase of the input clock, the voltage at node 114 is transferred to the internal node (I) of slave latch 104. Output buffer 116 includes series-connected transistors P8 and N8, with VDD connected to the source terminal of transistor P8 and VSS connected to the source terminal of transistor N8. Output buffer 116 acts as an inverter by receiving an input signal from internal node I at the gates of transistors P8 and N8 and outputting the inverse of the input signal at output QB. The output QB is input to the gates of transistors P9 and N9, which act as an inverter to invert the input signal at the output node Q. Feedback buffer 118 includes series-connected transistors P9 and N9, with VDD connected to the source terminal of transistor P9 and VSS connected to the source terminal of transistor N9. When the clock signal transitions from being asserted to not asserted, the output signal Q is fed through feedback path circuitry 120 to drive the internal node I at the input to output buffer 116, thereby latching the latched data value from master latch 102 at the output of slave latch 104.

Feedback path circuitry 120 includes series-connected P-type transistors, P10, P11 and P12 connected in parallel with series-connected N-type transistors N10, N11, and N12. Feedback path circuitry 120 is connected between output node Q and internal node I and provides two parallel transmission paths between those nodes. Transistor P10 is controlled by the reset signal R and transistor N10 is controlled by the complementary set signal SB (i.e. the complement of the set signal). P-type transistor P11 and n-type transistor N11 are controlled by the output signal QB. Transistor P12 is controlled by the clock signal CK and transistor N12 is controlled by the complement of the clock signal CKB.

During the transfer phase of the flip flop, the clock signal is asserted and transmission gate 124 allows the transfer of the voltage at node 114 to the internal node I. During this transfer phase, the asserted clock signal turns off transistors P12 and N12, disabling the feedback connection between output Q and internal node I. During the transfer phase, the inverters 116 and 118 are driven to a binary output state by the latched data value in master latch 102, wherein the output Q is driven to the digital value held at node 114 and the output QB is driven to the inverse of the digital value held at node 114. When the clock signal is driven to the latching phase of the flip-flop, wherein the clock signal is negated, transmission gate 124 is disabled and transistors P12 and N12 are switched on. Assuming that neither the reset nor set signals have been asserted, transistors P10 and N10 are switched on to allow transmission, and transistors P13 and N14 are switched off. Depending on the digital output value of output QB, one of transistors P11 and N11 is turned on and the other is turned off. With the output QB being driven strongly to one of the voltage supplies VDD or VSS, one of the transistors P11 or N11 is turned on strongly to allow the output Q to strongly drive internal node I at the input of inverter 116, thus latching slave latch 104 to the output value (i.e., if QB is being driven to a logic state 0 (VSS), transistor P11 will turn on strongly and transistor N11 will be turned off, and when output QB is being driven to a logic state 1 (VDD), transistor N11 will be turned on strongly and transistor P11 will be turned off.).

When it is desired to set or reset the outputs Q and QB of flip-flop 100 independent of the input data value D, the reset or set signals can be asserted accordingly. If the output Q is to be set to a logic high, the complement of the set signal (SB) is set to a logic low. As seen in FIG. 1, a low SB will turn off transistors N3, N10, and N13, and will turn on transistor P13, allowing the internal node I to be charged to VDD. Transistor N3 is turned off to disable master latch output buffer 110 and prevent current from flowing to VSS. As I rises, QB is driven to ground, concurrently turning off N11, turning on P11 and driving the output Q high. When the latch or flip-flop is reset, R is set to a logic high level. Transistor P3 is shut off, disabling the master latch output, and transistor N14 is turned on, pulling node I to ground (transistor N13 is turned on by SB at a logic high). Transistor P10 is turned off by R. As node I falls, QB is pulled up to VDD, turning off transistor P11. The slave latch 104 settles to the reset condition with buffer 116 driving QB high and buffer 118 driving Q low. To achieve high speed set and reset response times, minimum width devices are used for P10, P11, P12, N10, N11, and N12, while the widths of P13, N13 and N14 are set to at least three times minimum.

As will be described in detail in conjunction with FIGS. 2–5, feedback path circuitry 120 provides adaptive control of the internal node I during the latching phase of the flip-flop to prevent back-writing. When noise is coupled to the output QB, the variation towards the opposite logic state may be sufficient to switch the output value of inverter 118. However, as the output QB is driven towards the other logical state, both transistors P11 and N11 are turned off or weakened during the transition, preventing the internal node I from being completely switched by the changing output of inverter 118. With the internal node I isolated and held to the original latched digital value, inverter 116 continues to be driven to the original digital value allowing recovery of output QB from the noise spike. When output QB again attains its latched output value, one of transistors P11 and N11 is again turned on to allow feedback buffer 118 to drive internal node I to the proper latched digital value. As can be seen, a method of resisting back-writing in a latch circuit operates by generating two output signals in response to an input signal, where the input signal is generated in response to the second output signal, and adaptively controlling the input signal as a function of the output signal such that the input signal is prevented from switching from one of a first logic state and second logic state to the other of the first logic state and second logic state, while the output signal is substantially between the first logic state and the second logic state.

Figure 2:
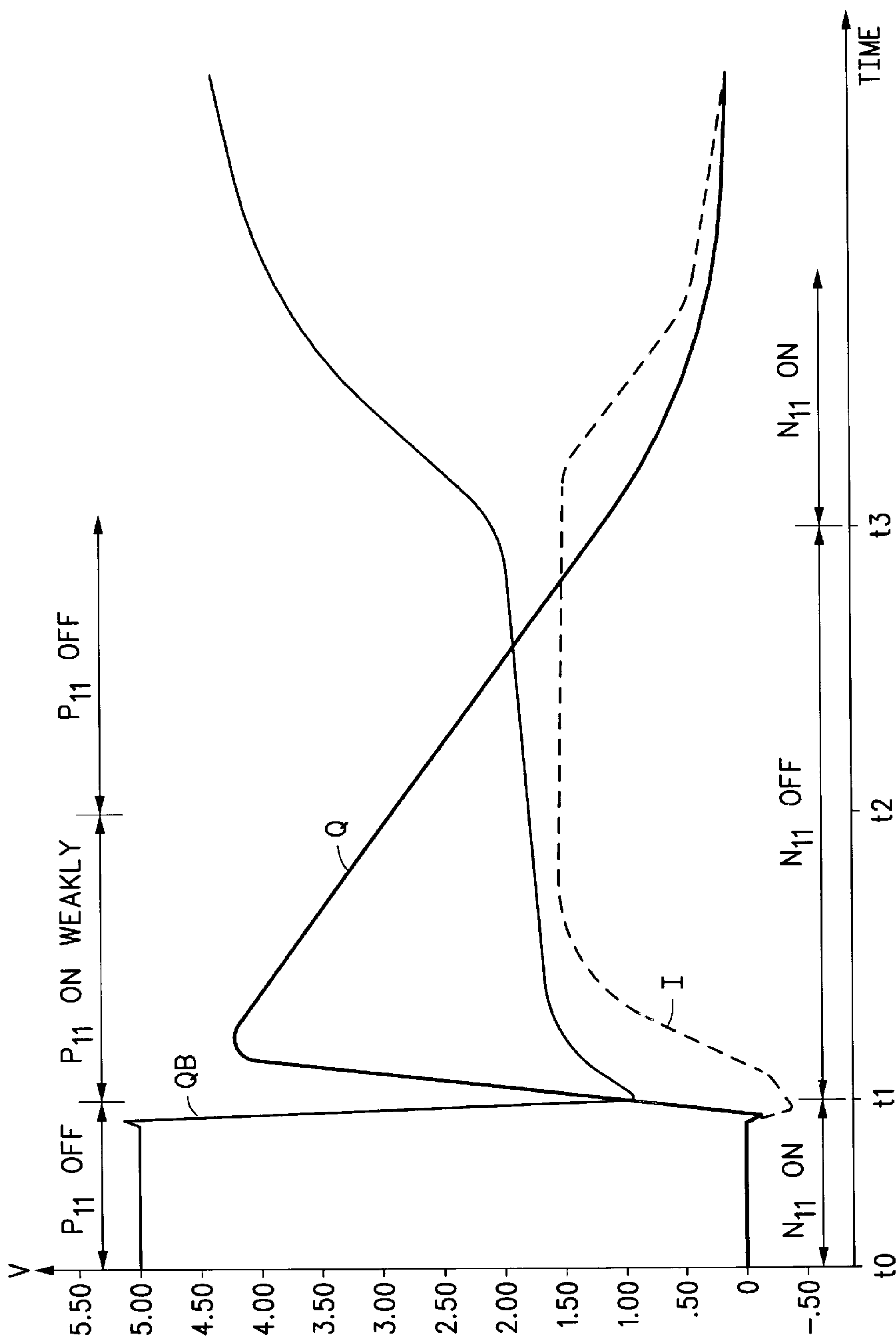
FIG. 2 shows a graph of voltage at selected nodes of flip-flop 100 over time for one example of the operation of the flip-flop in FIG. 1., in accordance with the preferred embodiment of the present invention.

With reference now to FIG. 2, there is shown a graph of voltage at selected nodes of flip-flop 100 over time for one example of the operation of the flip-flop in FIG. 1. In this example, and the examples described in conjunction with FIGS. 3–5, the digital high logic state is assumed to be VDD (5.00 volts) and the digital low logic state is VSS (0.00 volts, i.e. ground). Also, each of the graphs in FIGS. 2–5 graph the voltages on outputs Q and QB and at internal node I for the specified examples. FIG. 2 is an example of a case where a noise spike induced on the output QB causes the output QB to drop from a latched digital high logic value towards the digital low logic state. As seen in FIG. 2, prior to time $t_1$, output QB is held at 5 volts; transistor N11 is on and transistor P 11 is off. At time $t_1$, a noise source coupled to output QB causes a voltage spike on the output causing QB to fall towards ground. The voltage on QB drops below the threshold voltage of transistor N11, turning it off until the voltage on node QB rises above the threshold voltage of transistor N11 at time $t_3$. Also at time $t_1$, the drop in voltage of output node QB causes transistor P11 to turn on weakly, since the gate-to-source voltage of transistor P11 has dropped below the threshold voltage. The drop in the output QB drives inverter 118 to drive up the output Q. As can be seen from FIG. 2, with transistor P11 on weakly, the internal node I is driven higher by the output Q. However, because transistor P11 is on weakly and transistor N11 is off, the internal node I is only driven as high as 2 volts.

When internal node I reaches 2 Volts, output QB has been driven sufficiently high and output Q has been driven sufficiently low for transistor P11 to turn off. Inverter 116 continues to drive output QB at approximately 2 volts, which drives inverter 118 to push output Q back down towards the low logic state. At time $t_3$ output Q has been driven sufficiently low to generate a gate-to-source voltage on transistor N11 that reaches the transistor's threshold voltage. Thereafter, as N11 turns on, inverter 118 drives internal node I to its original digital low logic state. In accordance with the preferred embodiment, the voltage spike causing QB to fall was prevented from back-writing into the latch.

Figure 3:
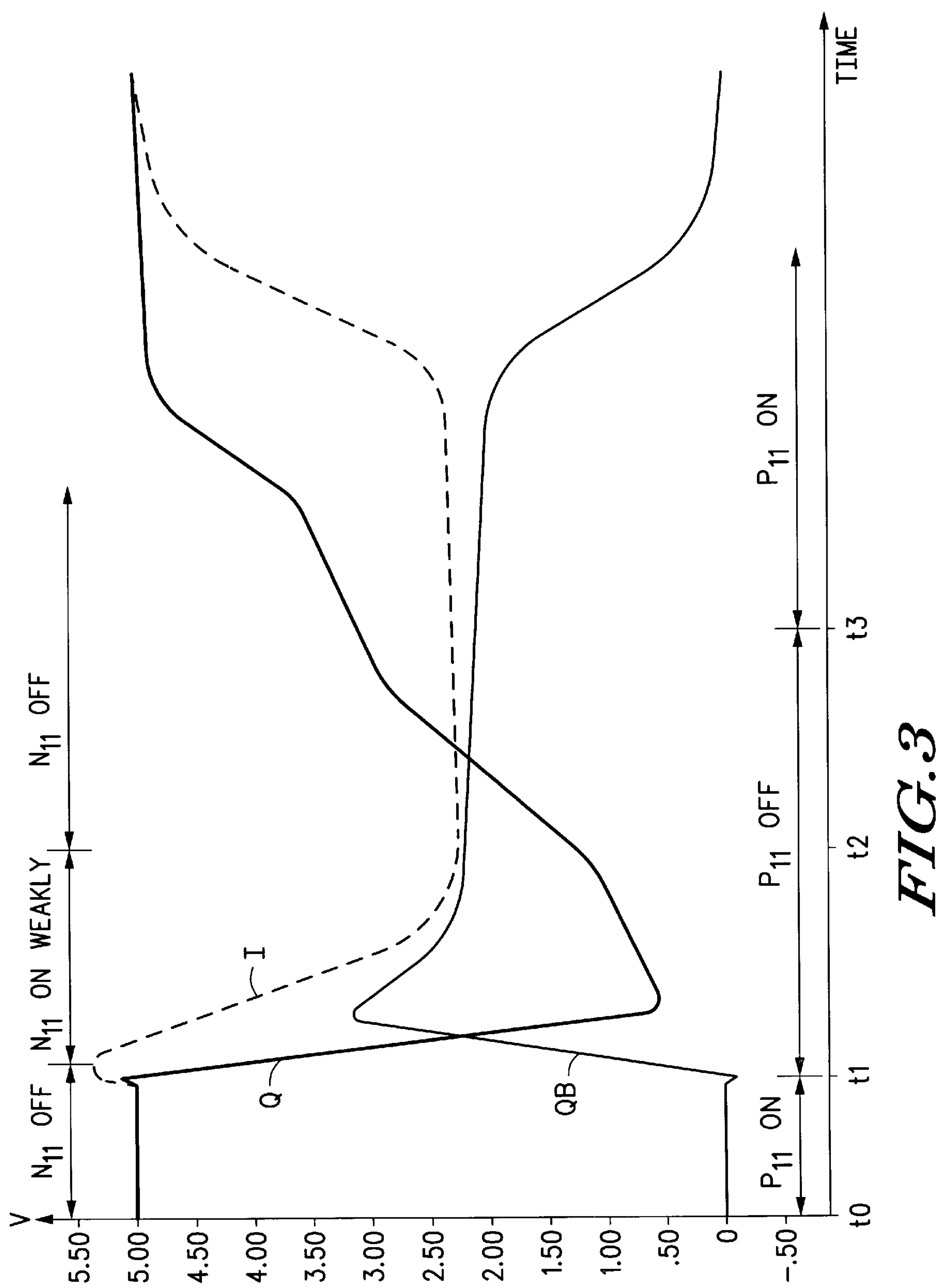
FIG. 3 shows a graph of voltage at selected nodes of flip-flop 100 over time for another example of the operation of the flip-flop in FIG. 1., in accordance with the preferred embodiment of the present invention.

With reference now to FIG. 3, there is shown a graph of the voltage at specific nodes of the flip-flop 100 shown in FIG. 1 over time for an example of the operation of the flip-flop shown in FIG. 1 when the voltage on output node QB rises due to an induced voltage noise spike. As seen in FIG. 3, between time $t_0$ and $t_1$, output Q is at a logical high value and output QB is at a logical low value. Also, transistor N11 is off and transistor P11 is on. At time $t_1$ a voltage spike on the output QB causes that output to rise to approximately 3 volts. In response, the output Q drops. Transistor P11 turns off and transistor N11 turns on weakly with the rise in output QB. Internal node I is driven down by the output Q, but is limited in its drop to about 2 volts. Inverter 116 continues to be driven by internal node I causing output QB to steadily drive inverter 118, pushing output Q towards the logical high state. At time $t_2$, output Q has been driven sufficiently high to reduce the gate-to-source voltage of transistor N11 to shut the transistor off. Output Q continues to rise until the gate-to-source voltage on transistor P11 is sufficient to turn the transistor on, thus allowing the output Q to drive the internal node I back toward the original logic high latched value.

Figure 4:
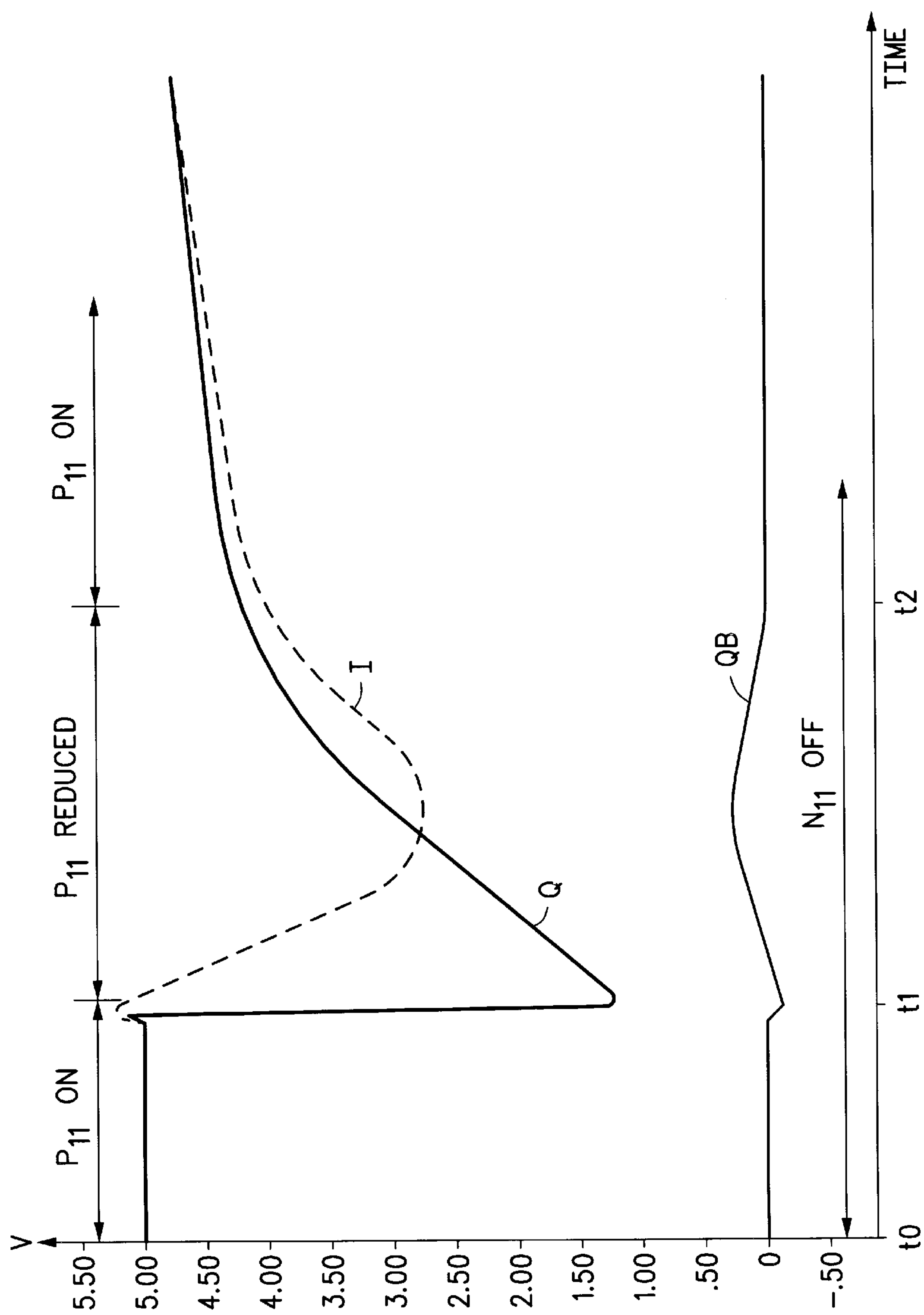
FIG. 4 shows a graph of voltage at selected nodes of flip-flop 100 over time for still another example of the operation of the flip-flop in FIG. 1., in accordance with the preferred embodiment of the present invention.

With reference now to FIG. 4, there is shown a graph of the voltage at specific nodes of the flip-flop 100 shown in FIG. 1 over time for an example of the operation of the flip-flop shown in FIG. 1 when a noise source coupled to output Q causes the voltage on the output Q to fall. As can be seen in FIG. 4, between time $t_0$ and $t_1$ the output QB is at zero volts and the output Q is at five volts. Transistor N11 is off and transistor P11 is on. At time $t_1$, a noise spike on the output Q causes the output Q to drop to approximately 1 volt. This spike drives internal node I lower and reduces the gate-to-source voltage on transistor P11, causing its drive to be reduced between time $t_1$ and $t_2$. Thus, the internal node I drops in voltage but is driven weakly by inverter 118 through the feedback path circuitry 120. As can be seen, this only marginally effects the output QB. Therefore, inverter 118 strongly drives the output Q back to the logic high output level.

Figure 5:
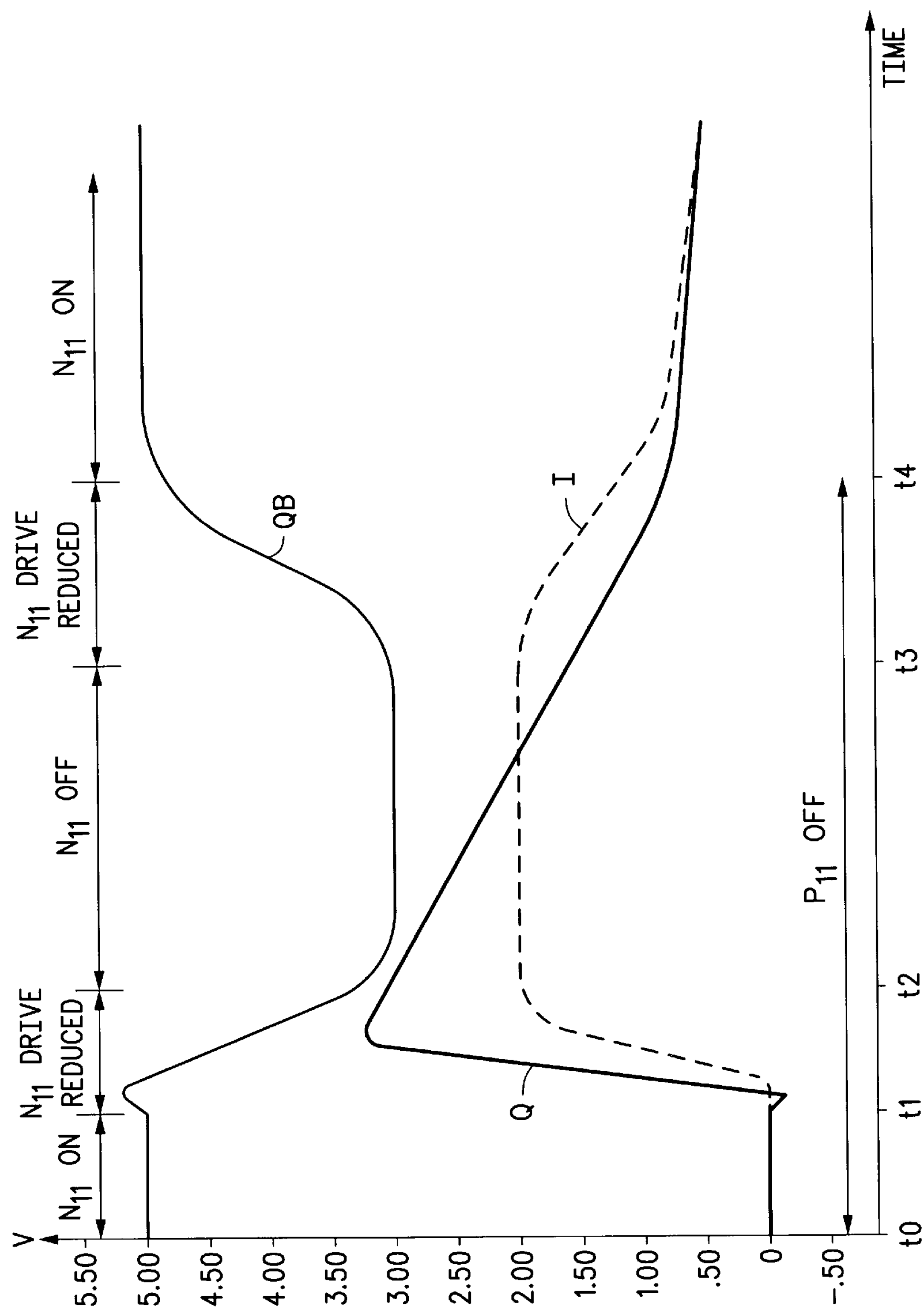
FIG. 5 shows a graph of voltage at selected nodes of flip-flop 100 over time for yet another example of the operation of the flip-flop in FIG. 1., in accordance with the preferred embodiment of the present invention.

With reference now to FIG. 5, there is shown a graph of the voltage at specific nodes of the flip-flop 100 shown in FIG. 1 over time for an example of the operation of the flip-flop shown in FIG. 1 when a noise source coupled to output Q causes that output to rise. Between times to and $t_1$, the output QB is latched to the logic high level and output Q is latched to the logic low level. At time $t_1$ a noise spike on output Q causes the output voltage on output Q to rise. This rising output causes the gate-to-source voltage on transistor N11 to drop, causing the transistor to have a reduced drive until time $t_2$. Therefore, internal node I is weakly driven higher until time $t_2$ when transistor N11 turns off. With both transistors N11 and P11 turned off, the feedback path is disabled and internal node I retains a steady level to drive inverter 116. This in turn drives output QB at a constant level, forcing inverter 118 to drive output Q back down from the spike level. At time $t_3$ output Q has been sufficiently driven towards the logic low level for transistor N11 to turn on weakly between times $t_3$ and $t_4$ and to allow output Q to drive the internal node I towards the low level. At time $t_4$ transistor N11 is turned on strongly, allowing output Q to strongly drive internal node I towards logic low level, and correspondingly drive inverter 116 at output QB towards the logic high level.

As will now be appreciated, the present invention provides an unbuffered flip-flop including feedback control circuitry that provides adaptive control of the internal node during the latching phase of the flip-flop to prevent back-writing. A complementary pair of transmission gates controlled by the output node are included in the feedback path between an output buffer and a feedback buffer. As noise voltage variations and spikes alter the voltage on the output node, the charge transmittance of the transmission gates is weakened or shut off, thereby preventing the incorrect logic state from being driven by the feedback buffer through to the input of the flip-flop's output buffer and causing back writing. Because the transmission gate transistors are complementary, one transistor or the other will be operating in a transmissive state for each of the bi-stable states of the output buffer during static operation of the flip-flop. As will be appreciated, because only two extra transistors are needed, the present invention has improved performance over the prior art, while consuming very little silicon area, power, and adding almost no delay to the circuit.

While the invention has been described in the context of a preferred embodiment, it will be apparent to those skilled in the art that the present invention may be modified in numerous ways and may assume many embodiments other than that specifically set out and described above. Accordingly, it is intended by the appended claims to cover all modifications of the invention which fall within the true scope of the invention.

What is claimed is:

1. A latch circuit comprising:

a first inverter having an input and an output;

a second inverter having an input and an output, the second inverter input being coupled to the first inverter output and the second inverter output being coupled to the first inverter input; and a feedback path circuit coupling the second inverter output and the first inverter input in response to the first inverter output.

2. The latch circuit of claim 1, wherein the first inverter and second inverter each comprise a complementary pair of transistors.

3. The latch circuit of claim 1, wherein the feedback path circuit is a first transistor coupled between the second inverter output and the first inverter input and controlled by the first inverter output.

4. The latch circuit of claim 3, wherein the first transistor is a PMOS transistor.

5. The latch circuit of claim 3, further comprising a second transistor coupled between the second inverter output and the first inverter input and being controlled by the first inverter output.

6. The latch circuit of claim 5, wherein the first transistor is a PMOS transistor and the second transistor is a NMOS transistor.

7. The latch circuit of claim 1 wherein the feedback path circuit comprises:

a first pair of transistors connected serially with one another wherein a first transistor within the first pair of transistors is controlled by the output of the first inverter and a second transistor within the first pair of transistors is controlled by a clock signal; and a second pair of transistors connected serially with one another, wherein the first and second pair of transistors are coupled in parallel to each other between the first and second inverters and wherein a first transistor within the second pair of transistors is controlled by the output of the first inverter and a second transistor within the second pair of transistors is controlled by a complementary clock signal.

8. The latch circuit of claim 1 wherein the feedback path circuit comprises:

a first pair of transistors connected serially with one another wherein a first transistor within the first pair of transistors is controlled by the output of the first inverter and a second transistor within the first pair of transistors is controlled by a reset signal; and a second pair of transistors connected serially with one another, wherein the first and second pair of transistors are coupled in parallel to each other between the first and second inverters and wherein a first transistor within the second pair of transistors is controlled by the output of the first inverter and a second transistor within the second pair of transistors is controlled by a set signal.

9. The latch circuit of claim 1 wherein the feedback path circuit comprises:

a first set of transistors connected serially with one another wherein a first transistor within the first set is controlled by the output of the first inverter, a second transistor within the first set is controlled by a reset signal, and a third transistor within the first set is controlled by a clock signal; and a second set of transistors connected serially with one another wherein a first transistor within the second set is controlled by the output of the first inverter, a second transistor within the second set is controlled by a reset signal, and a third transistor within the second set is controlled by a complentary clock signal.

10. The latch circuit of claim 9 wherein the first, second, and third transistors within the first set of transistors are all P channel transistors and the first, second, and third transistors within the second set of transistors are all N channel transistors.

11. The latch circuit of claim 1 wherein the first inverter, the second inverter, and the feedback path circuit intercouple to form a slave latch that is coupled to a master latch via a transmission gate.

12. The latch circuit of claim 11 wherein the feedback path circuit of the slave latch and the transmission gate are clocked so that only one of the feedback path circuit or the transmission gate is substantially passing an electrical signal at any one point in time.

13. The latch circuit of claim 11 wherein the master latch contains an inverter feedback path and an input buffer circuit wherein the input buffer circuit and the inverter feedback path are clocked so that only one of the input buffer circuit or the inverter feedback path is substantially passing an electrical signal at any one point in time.

14. A latch circuit comprising:

a first inverter having an input and an output and being comprised of a first pair of complementary transistors connected in series;

a second inverter having an input and an output and being comprised of a second pair of complementary transistors connected in series, the second inverter input being coupled to the first inverter output and the second inverter output being coupled to the first inverter input; and a third pair of complementary transistors connected in parallel and being coupled between the second inverter output and the first inverter input and each transistor of the third pair of complementary transistors being controlled by the first inverter output.

15. The latch circuit of claim 14, wherein the first, second and third pair of complementary transistors are CMOS transistors.

16. The latch circuit of claim 14, wherein a first transistor of the third pair of complementary transistors connected in series with a first clock transistor and a second clock transistor connected in series with a second transistor of the third pair of complementary transistors, wherein the first clock transistor and the second clock transistor are controlled by a clock signal and a complement of the clock signal, respectively.

17. The latch circuit of claim 14, further comprising a master latch coupled to the first inverter input.

18. The latch circuit of claim 17, further comprising a fourth pair of complementary transistors connected in parallel and between the master latch and the first inverter input, wherein a first transistor and a second transistor of the fourth pair of complementary transistors are controlled by a clock signal and a complement of the clock signal, respectively.

19. A method of resisting back-writing in a latch circuit, the method comprising the steps of:

generating a first output signal in response to an input signal, wherein the first output signal has a first logic state and a second logic state;

generating a second output signal in response to the first output signal;

generating the input signal in response to the second output signal; and controlling the input signal as a function of the first output signal, a clock signal and a reset signal such that the input signal is prevented from switching from one of the first logic state and second logic state to the other of the first logic state and second logic state while the first output signal is substantially between the first logic state and the second logic state.

20. The method according to claim 19, wherein the step of generating the input signal in response to the second output signal occurs during a latching phase and further comprising the step of generating the input signal during an input phase, wherein the input signal is not generated in response to the second output during the input phase.

* * * * *